(12) United States Patent
Bierhuizen et al.

(10) Patent No.: US 7,994,529 B2
(45) Date of Patent: Aug. 9, 2011

(54) LED WITH MOLDED BI-DIRECTIONAL OPTICS

(75) Inventors: Serge Bierhuizen, Santa Rosa, CA (US); Mark Butterworth, Santa Clara, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 221 days.

(21) Appl. No.: 12/265,131

(22) Filed: Nov. 5, 2008

(65) Prior Publication Data

US 2010/0109034 A1    May 6, 2010

(51) Int. Cl.
*H01L 33/00* (2010.01)
(52) U.S. Cl. ............... 257/98; 257/99; 257/E33.072; 257/E33.073; 438/27
(58) Field of Classification Search ............ 257/98, 257/99, 100, E33.072, E33.073; 438/27, 438/30, 31
See application file for complete search history.

(56) References Cited

U.S. PATENT DOCUMENTS

| | | |
|---|---|---|
| 2004/0252520 A1 | 12/2004 | Martineau et al. |
| 2005/0265035 A1 | 12/2005 | Brass et al. |
| 2006/0102914 A1 | 5/2006 | Smits et al. |
| 2007/0138494 A1 | 6/2007 | Pugh et al. |
| 2008/0186737 A1 | 8/2008 | Awai et al. |

FOREIGN PATENT DOCUMENTS

| | | |
|---|---|---|
| WO | 2007138294 A1 | 12/2007 |
| WO | 2008018615 A1 | 2/2008 |

OTHER PUBLICATIONS

International Search Report,PCT/IB2009/054805.

*Primary Examiner* — Minh-Loan T Tran

(57) ABSTRACT

A double-molded lens for an LED includes an outer lens molded around the periphery of an LED die and a collimating inner lens molded over the top surface of the LED die and partially defined by a central opening in the outer lens. The outer lens is formed using silicone having a relatively low index of refraction such as n=1.33-1.47, and the inner lens is formed of a higher index silicone, such as n=1.54-1.76, to cause TIR within the inner lens. Light not internally reflected by the inner lens is transmitted into the outer lens. The shape of the outer lens determines the side emission pattern of the light. The front and side emission patterns separately created by the two lenses may be tailored for a particular backlight or automotive application.

15 Claims, 5 Drawing Sheets

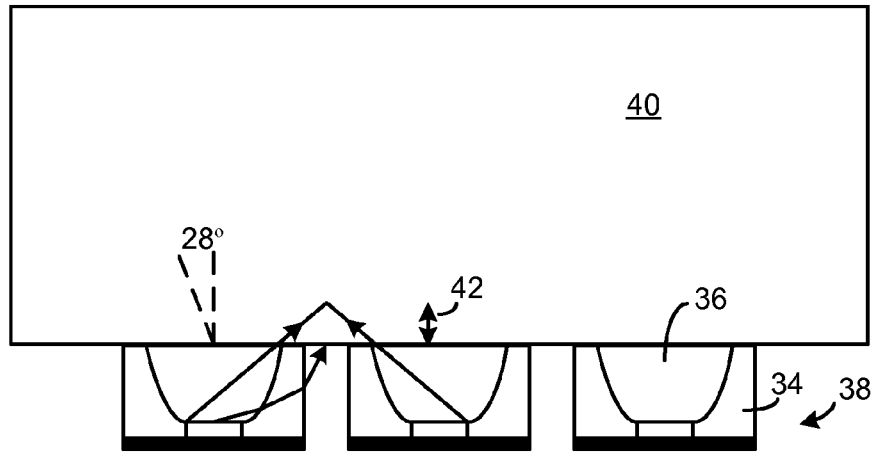
Fig. 4
Fig. 5
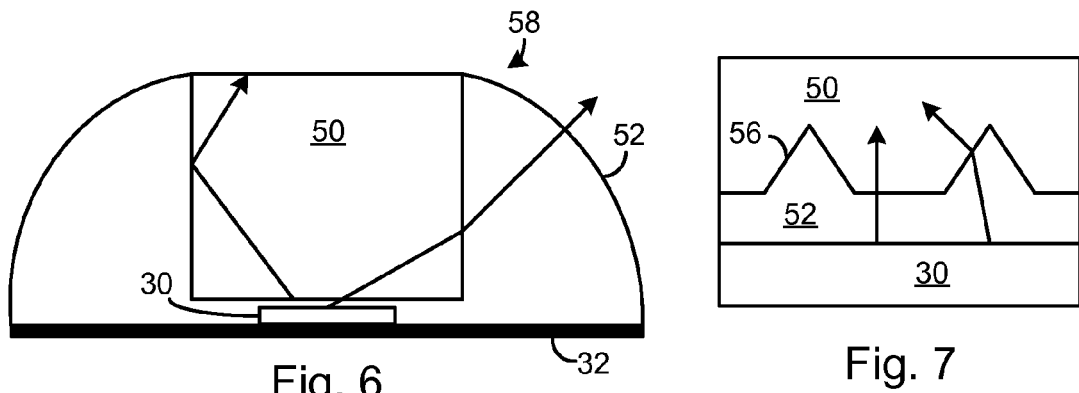
Fig. 6
Fig. 7
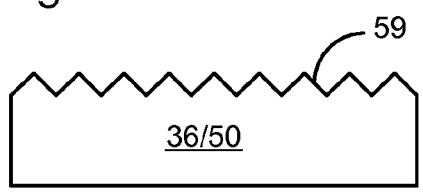
Fig. 8

LED WITH MOLDED BI-DIRECTIONAL OPTICS

FIELD OF THE INVENTION

This invention relates to lenses for light emitting diodes (LEDs) and, in particular, to a double-molded lens using two materials having different indices of refraction to shape the front and side light emission.

BACKGROUND

Backlights for liquid crystal displays (LCDs) are sometimes formed using a rectangular plastic waveguide (or lightguide) with one or more LEDs optically coupled to an edge of the waveguide. The LEDs may include a phosphor coating to create white light.

FIG. 1 is a top down view of a portion of a backlight waveguide 10 with three identical LEDs 12 optically coupled to an edge of the waveguide 10. Each LED may comprise a blue emission LED die 14 (e.g., a GaN LED) mounted on a submount 16, a phosphor layer (not shown) over the die to contribute red and green light components to create white light, and a domed lens 18. The lens 18 is typically hemispherical so that the light emission is Lambertian. The lens is formed of a high index of refraction (n) plastic or silicone to increase the light extraction from the LED die 14 by increasing the critical angle at the die interface. Therefore, by using such a lens 18, the total internal reflection (TIR) within the die 14 is reduced compared to if the LED die 14 had no lens and had a die/air interface.

In a backlight waveguide illuminated by multiple LEDs along its edge, the LED light needs to merge and mix within the waveguide so as to be generally uniform. This mixing naturally occurs as the light from each LED spreads out within the waveguide and merges. However, the light near the edge of the waveguide 10, in the mixing region 20, is not uniform, so that part of the waveguide 10 near the LEDs 12 is not used to backlight an LCD 24 (FIG. 2). Light rays (shown as lines with arrows) are refracted toward the normal as light goes from a lower n to a higher n, such as from the air gaps of FIG. 1 into the plastic (e.g., PMMA) waveguide 10. This refraction increases the depth of the mixing region 20 near the edge. This mixing region adds width to the backlight, which is undesirable. One solution to shorten the mixing region is to decrease the pitch of the LEDs, but this adds cost.

FIG. 2 illustrates a side view of the backlight of FIG. 1 showing how a light ray 25 from an LED 12 striking the top surface of the waveguide 10 at greater than the critical angle is totally internally reflected by the smooth top surface of the waveguide 10. Such TIR is important to prevent non-uniform leaking of light through the top surface. The waveguide 10 typically has prisms 22 or roughening on its bottom surface to reflect light upward to uniformly leak out the top surface to illuminate an LCD 24.

The waveguide 10 should be thick enough to receive a high percentage of the emitted LED light coupled to its edge. A reflector around the LEDs may be used to direct side light from the LEDs toward the waveguide edge, but such a reflector adds space and cost.

What is needed is optics for LEDs that optically couple an LED die to a backlight so that the mixing region is shorter and so that the waveguide can be made thinner without losing efficiency.

SUMMARY

A double-molded lens for an LED is disclosed. An outer lens is first molded around the periphery of an LED die, where the outer lens is formed using silicone having a relatively low index of refraction such as n=1.33-1.47. The outer lens shape primarily determines the side emission pattern of the LED. An inner lens is then molded within the center opening of the outer lens so as to be directly over the top surface of the LED die, where the inner lens is formed of a higher index silicone, such as n=1.54-1.76. The light emitted from the top surface of the LED die is collimated by the inner lens, since there is TIR within the inner lens due to its index of refraction being higher than that of the outer lens. The inner lens may form a cylinder, a parabolic shape, or other shape that substantially collimates a majority of the light entering the inner lens. For example, the collimated light entering the waveguide may be within 28° from the normal. Light from the LED die striking the inner lens sidewall at less than the critical angle for TIR is transmitted into the outer lens. The shape of the outer lens determines the side emission pattern of the light (e.g., peak intensity at 45° from normal).

The top surface of the double-molded lens may be flat so it can directly abut an edge of a plastic waveguide. Therefore, there is no air gap (n=1) that would cause the light to substantially refract to the normal when entering the waveguide. Therefore, the mixing region within the waveguide is shorter, enabling the use of smaller waveguides. Further, the side emission pattern created by the outer lens can be tailored for a particular waveguide application (e.g., LED pitch) to provide good mixing with the light from adjacent LEDs at or near the edge of the waveguide, so the mixing region is further shortened. The collimating inner lens creates a narrower beam (compared to a domed lens) that is inherently mixed with other collimated beams deeper into the waveguide, but the light closer to the edge is already uniform due to the mixing of the side-light.

In another embodiment, the outer lens material forms a layer directly on the top surface of the die, and the inner lens material is molded over that layer. The layer may include optical features such as a concave shape or scattering features. Various other lens designs are disclosed.

The invention may also be used for light applications other than backlights, where the vertical light emission pattern (collimation pattern) and the side-light emission pattern can be substantially independently specified.

BRIEF DESCRIPTION OF THE DRAWINGS

FIG. 4 is a top down cross-sectional view of a portion of a backlight waveguide optically coupled to the LED of FIG. 3.

FIG. 5 is side cross-sectional view of the backlight waveguide of FIG. 4.

FIG. 6 is a side cross-sectional view of another double-molded lens shape for creating a collimating beam pattern and a side-light emission pattern.

FIG. 7 is a close-up view of a portion of the top surface of the LED die of FIG. 6 and a lens pattern molded over the die surface for scattering light to shape the side-light emission pattern.

FIG. 8 is a close-up cross-section of the top surface of the inner lens of FIG. 3 or 6, illustrating that the top surface may have an optical pattern molded in it for scattering light.

Elements that are the same or equivalent are labeled with the same numeral.

DETAILED DESCRIPTION

The present invention may use conventional white light LED dies, such as AlInGaN blue LEDs with a phosphor layer, manufactured by the present assignee. A flip-chip LED die is used in the examples herein for simplicity. Examples of forming LEDs are described in U.S. Pat. Nos. 6,649,440 and 6,274,399, both assigned to Philips Lumileds Lighting and incorporated by reference. A phosphor layer over the blue LED die that emits red and green color components causes the LED to emit white light. Forming ceramic phosphor plates is described in U.S. patent publication 20050269582, entitled Luminescent Ceramic for a Light Emitting Diode, by Gerd Mueller et al., incorporated herein by reference. As used herein, the term LED die comprises either a bare die or a die having a phosphor coating or phosphor plate.

Figure 3:
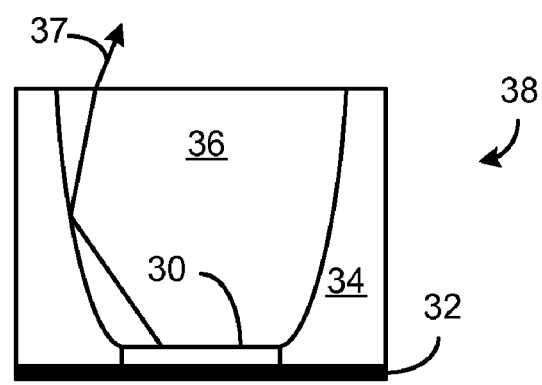
FIG. 3 is a side cross-sectional view of a double-molded lens over an LED die in accordance with one embodiment of the invention.

FIG. 3 shows a conventional flip-chip LED die 30 mounted on a conventional submount 32. The submount 32 may be ceramic, silicon, or other material. The submount 32 contains top bonding pads for direct bonding to the anode and cathode metal contacts on the bottom surface of the LED die 30. The bonding pads on the submount 32 are connected by traces or vias to other pads that connect to a leadframe of a package or to a circuit board. Attachment of an LED die to a submount is described in U.S. Pat. No. 7,344,902, by Grigoriy Basin, entitled Overmolded Lens Over LED Die, assigned to the present assignee and incorporated herein by reference.

Around the periphery of the LED die 30 is molded an outer lens 34 formed of silicone having a relatively low index of refraction (n) of about 1.33. Other n values may be used, such as up to about 1.47. Such material is commercially available. The molding process leaves a center opening in the outer lens 34. An inner lens 36 is then molded within the outer lens 34, where the inner lens 36 is formed of silicone with a higher index value of n=1.54-1.76. Such material is commercially available. Since the shape of the inner lens 36 is partly determined by the center opening of the outer lens 34, the molding tolerance is relaxed. In the example of FIG. 3, the inner lens 36 substantially forms a parabolic shape. Since the LED die 30 is not a point source, all areas of the LED die are not at the focal point of the parabolic shape, so the light emitted from the inner lens 36 will not be perfectly collimated. Since the n of the inner lens 36 is higher than the n of the outer lens 34, there will be TIR of light incident at greater than the critical angle, determined by Snell's law. The shape of the inner lens 36 and the relative n values of the lens materials determine the light pattern emitted by the inner lens 36. One light ray 37 is shown.

The outer lens 34 may be shaped to create any emission pattern of light that passes through the sides of the inner lens 36.

The height of the lens 34/36 may be up to 6 mm for a 1 mm² LED die. The width of the entire lens 34/36 depends on the desired emission pattern. The inner lens 36 may have an exit diameter of up to three times the width of the LED die. The lens 34/36 may be symmetrical about the center axis (have a circular shape), as viewed from above, or the lens 34/36 may have a rectangular shape or other asymmetrical shape for better mixing of light within a waveguide.

Figure 1:
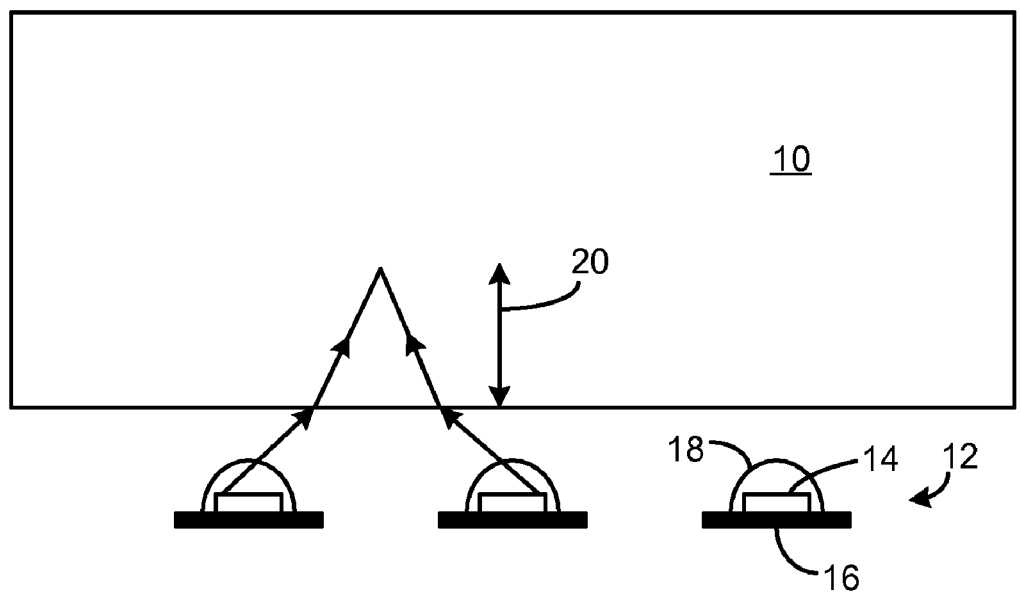
FIG. 1 is a prior art top down cross-sectional view of LEDs optically coupled to a portion of a backlight waveguide for an LCD.
Figure 2:
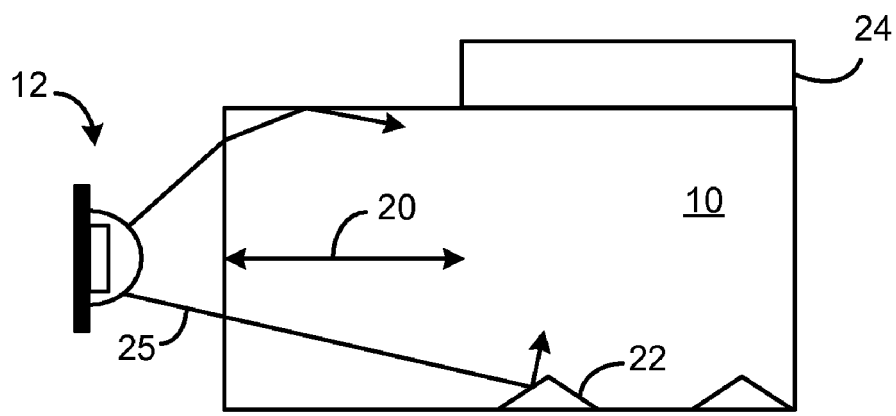
FIG. 2 is a side cross-sectional view of the backlight waveguide of FIG. 1.

FIG. 4 illustrates the flat top surface of the lenses 34/36 of FIG. 3 optically coupled to an edge of a plastic (e.g., PMMA) waveguide 40 with no air gap in-between. A thin layer of high index silicone may affix the lenses to the waveguide 40, or a bezel may cause the lenses to abut the edge of the waveguide 40. Since there is no air interface (n=1), there is little refraction of the light toward the normal when entering the waveguide (n=approx. 1.5); therefore, the mixing region 42 is shorter compared to the mixing region 20 of FIG. 1. Also the shape of the inner lens 36 can be designed to provide a wide angle emission or a narrow angle emission into the waveguide 40 to achieve the desired mixing of light. In one embodiment, the half-brightness emission angle from the inner lens 36 into the waveguide 40 is about 28° off the normal, but the angle can be more or less depending on the optimal angle for mixing. Side-light from the outer lenses 36 of adjacent LEDs entering the waveguide 40 will mix before the edge or close to the edge, resulting in a short mixing region 42.

FIG. 5 is a side view of the waveguide 40 of FIG. 4 illustrating how the light rays greater than the critical angle are totally reflected off the top surface of the waveguide 40. Prisms 44 or other light-scattering features on the bottom surface of the waveguide 40 reflect light upward to uniformly leak light out the top surface for illuminating an LCD 46. Since the mixing region 42 is short, the edge of the LCD 46 may be closer to the edge of the waveguide 40, enabling the used of a smaller waveguide 40.

FIG. 6 is a cross-sectional view of another lens design where the silicone inner lens 50 is substantially cylindrical, and the silicone outer lens 52 has a generally hemispherical shape for a relatively wide emission pattern. The inner lens 50 has an n value greater than the n value of the outer lens 52 to cause TIR.

During the molding process, it is difficult to prevent a layer of the outer lens material from forming over the top surface of the LED die, since the delicate LED die should not touch the mold itself. FIG. 7 is a close-up of a portion of the LED die 30 surface illustrating how this thin layer of the outer lens material over the LED die may include molded light-scattering shapes 56 to increase the amount of light escaping from the inner lens 50 into the outer lens 52 by causing more light to be less than the critical angle for passing through the side wall of the inner lens 50.

FIG. 8 is a close-up cross-section of the top surface of the inner lens of FIG. 3 or 6, illustrating that the top surface may be molded to have an optical pattern 59 molded in it for scattering or redirecting the light. The surface can be textured in many ways for light scattering or redirecting the light, such as using prisms, bumps, pits, truncated pyramids, random roughening, or a surface relief hologram. The surface may also be roughened by bead blasting. An optical film coating may also be used to redirect the light.

Figure 9:
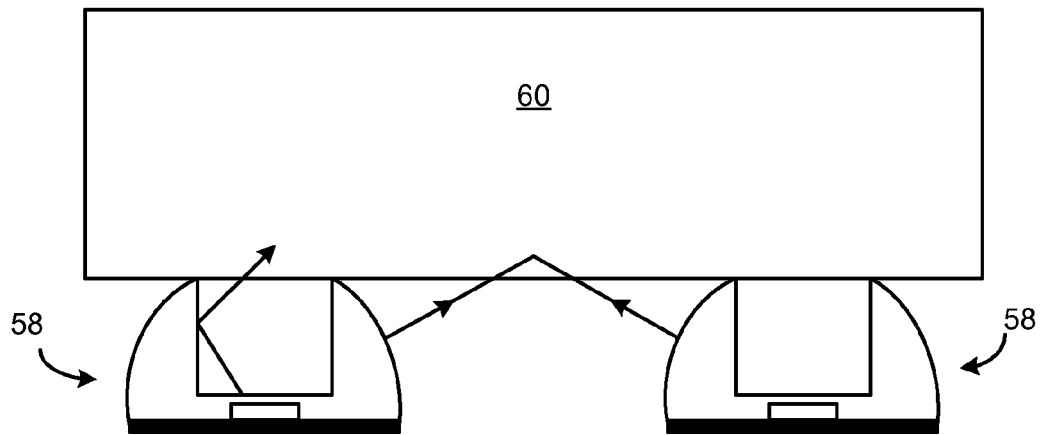
FIG. 9 is cross-sectional view of the LED of FIG. 6 optically coupled to a portion of a backlight waveguide for an LCD.

FIG. 9 illustrates the LED 58 of FIG. 6 optically coupled to an edge of a backlight waveguide 60. The inner lens 50, the outer lens 52, the pitch of the LEDs 58 and other factors may be selected so that the mixing region within the waveguide 60 to create uniform light is short.

Figure 10:
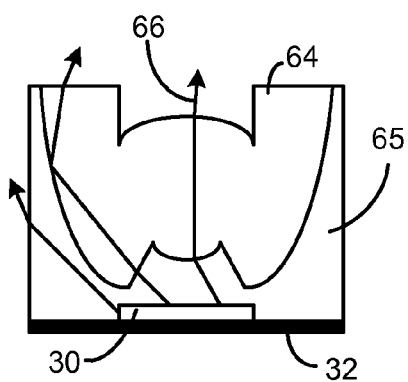
FIG. 10 is a side cross-sectional view of another double-molded lens shape.

FIG. 10 illustrates an inner lens 64 that has a convex-shaped top surface for further controlling the frontal emission. The outer lens material 65 is also molded to form a thick region over the top surface of the LED die, which affects the front and side emission patterns. The outer lens material 65 overlying the LED die 30 has a concave shape to reduce TIR of light rays generally directed upward. Some light rays 66 are shown to illustrate the various effects of the lens shapes. Shaping the lenses may be done to improve the uniformity of light in the backlight waveguide and/or shorten the light mixing region in the backlight waveguide. Alternatively, the shaping may be done to achieve any light pattern for a non-backlight application, such as an automotive application.

Figure 11:
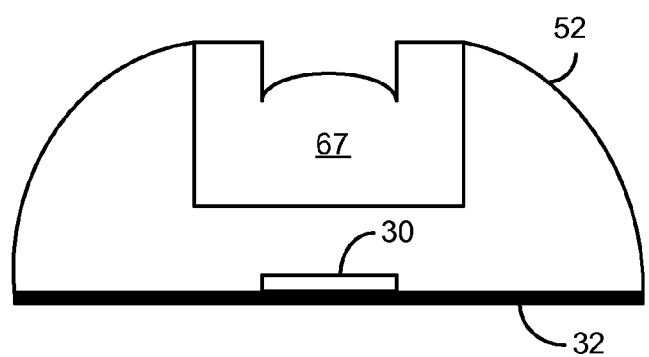
FIG. 11 is a side cross-sectional view of another double-molded lens shape.

FIG. 11 illustrates a thicker layer of the outer lens material 52 over the LED die 30 top surface for increased side light emission. The inner lens 67 is similar to that of FIG. 10.

Figure 12:
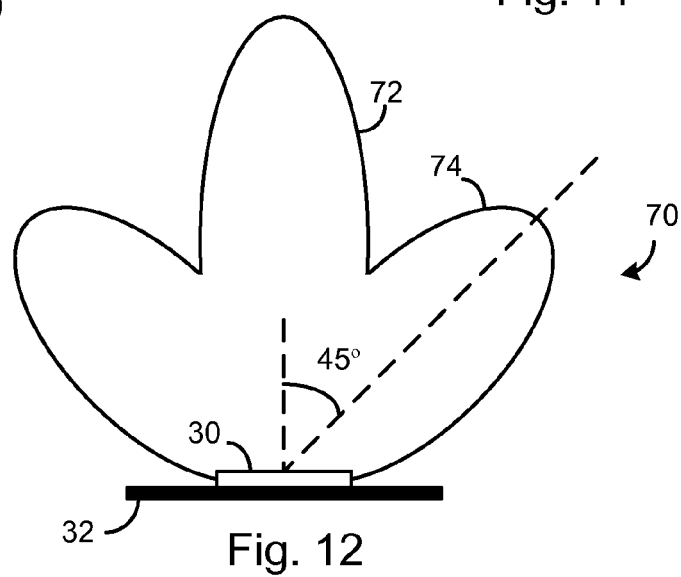
FIG. 12 illustrates a sample emission pattern of an LED using the double-molded lens, where the frontal light emission pattern and the side-light emission pattern can be individually tailored for a particular application.

FIG. 12 illustrates a symmetrical half-brightness emission pattern 70 of an LED with the double-molded lenses, showing a frontal emission pattern 72 determined by the inner lens and a side emission pattern 74 determined by the outer lens. The shapes of the frontal and side emission patterns can be adjusted substantially independently by changing the shapes of the inner and outer lenses. In one embodiment, the peak intensity of the side emission lobes is 45°-65° from the normal, and the collimated frontal emission has a 10°-35° spread from the normal into the waveguide when directly coupled to the waveguide with no air gap.

Figure 13:
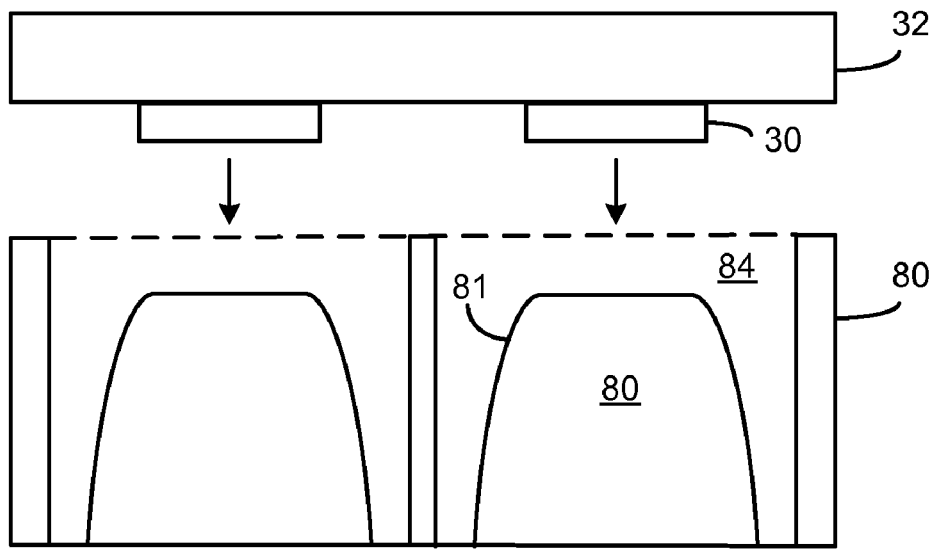
FIG. 13 illustrates a first molding step for forming the outer lens.
Figure 14:
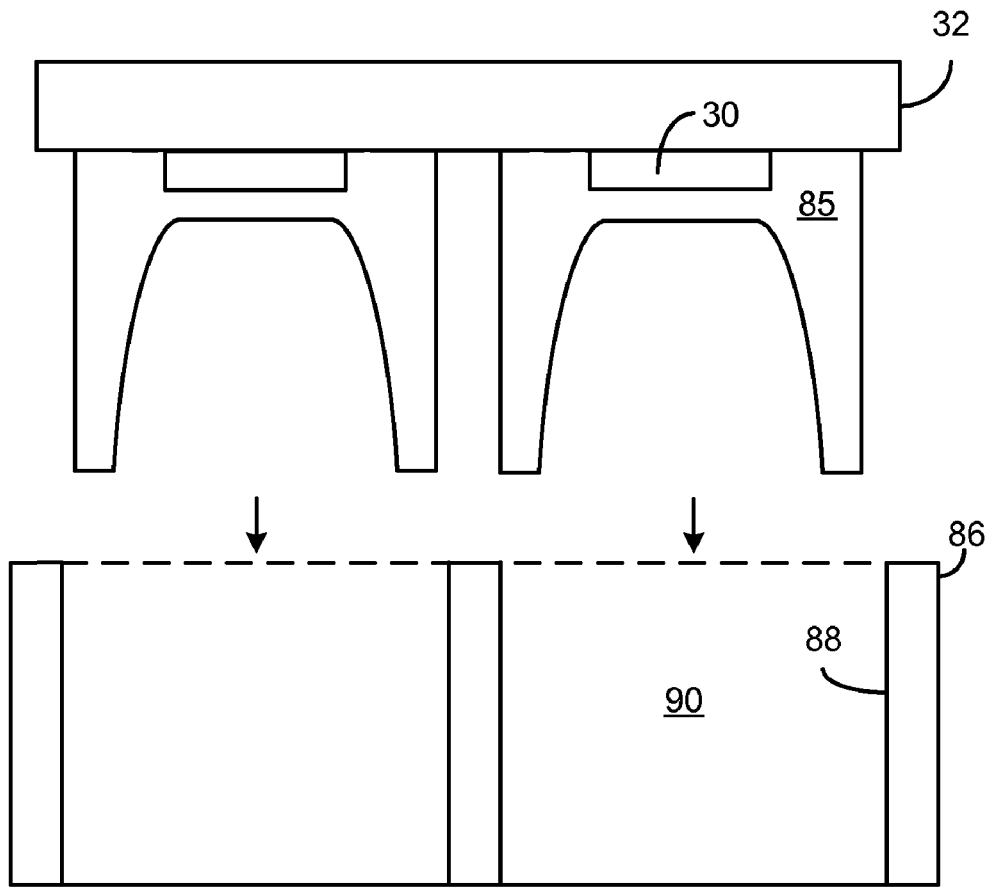
FIG. 14 illustrates a second molding step for forming the inner lens, which is at least partly defined by the inner surface shape of the outer lens, where the index of refraction of the material used to form the inner lens is higher than index of refraction of the material used to form the outer lens to achieve TIR.

FIGS. 13 and 14 illustrate a wafer-scale double molding process. LED dies 30 are mounted on a substrate wafer 32 containing possibly hundreds of identical LED dies 30.

A mold 80 has indentations 81 corresponding to the desired shape of the outer lens over each LED die 30. The mold 80 is preferably formed of a metal having a non-stick surface or a release layer.

The mold indentions 81 are filled with liquid or softened heat-curable silicone 84 having an index of refraction such as 1.33.

The wafer 32 and the mold 80 are brought together, and a vacuum seal is created between the periphery of the wafer 32 and the mold 80. Therefore, each LED die 30 is inserted into the silicone 84, and the silicone 84 is under compression.

The mold 80 is then heated to about 150 degrees centigrade (or other suitable temperature) for a time to harden the silicone 84.

The wafer 32 is then separated from the mold 80. The silicone 84 may then be additionally cured by heat or UV light. FIG. 14 shows the resulting outer lens 85, with a thin layer over the top surface of the LED die 30 caused by a gap between the die's top surface and the hard mold 80. The thin layer may have molded light-scattering features (shown in FIG. 7).

In FIG. 14, a second mold 86 has indentions 88 that, in combination with the inner surface of the outer lens 85, are used to form the inner lens. The mold indentions 88 are filled with liquid or softened heat-curable silicone 90 having a high index of refraction such as 1.54-1.76. The wafer 32 and mold 86 are brought together as previously described. The silicone 90 is then cured, and the wafer 32 and mold 86 are separated to produce the LEDs shown in FIG. 3. All the LEDs on the submount wafer 32 are processed simultaneously.

The submount wafer 32 is then diced to separate the LEDs. The LED submounts may then be mounted on a circuit board strip along with other LED submounts for use in a backlight.

Figure 15:
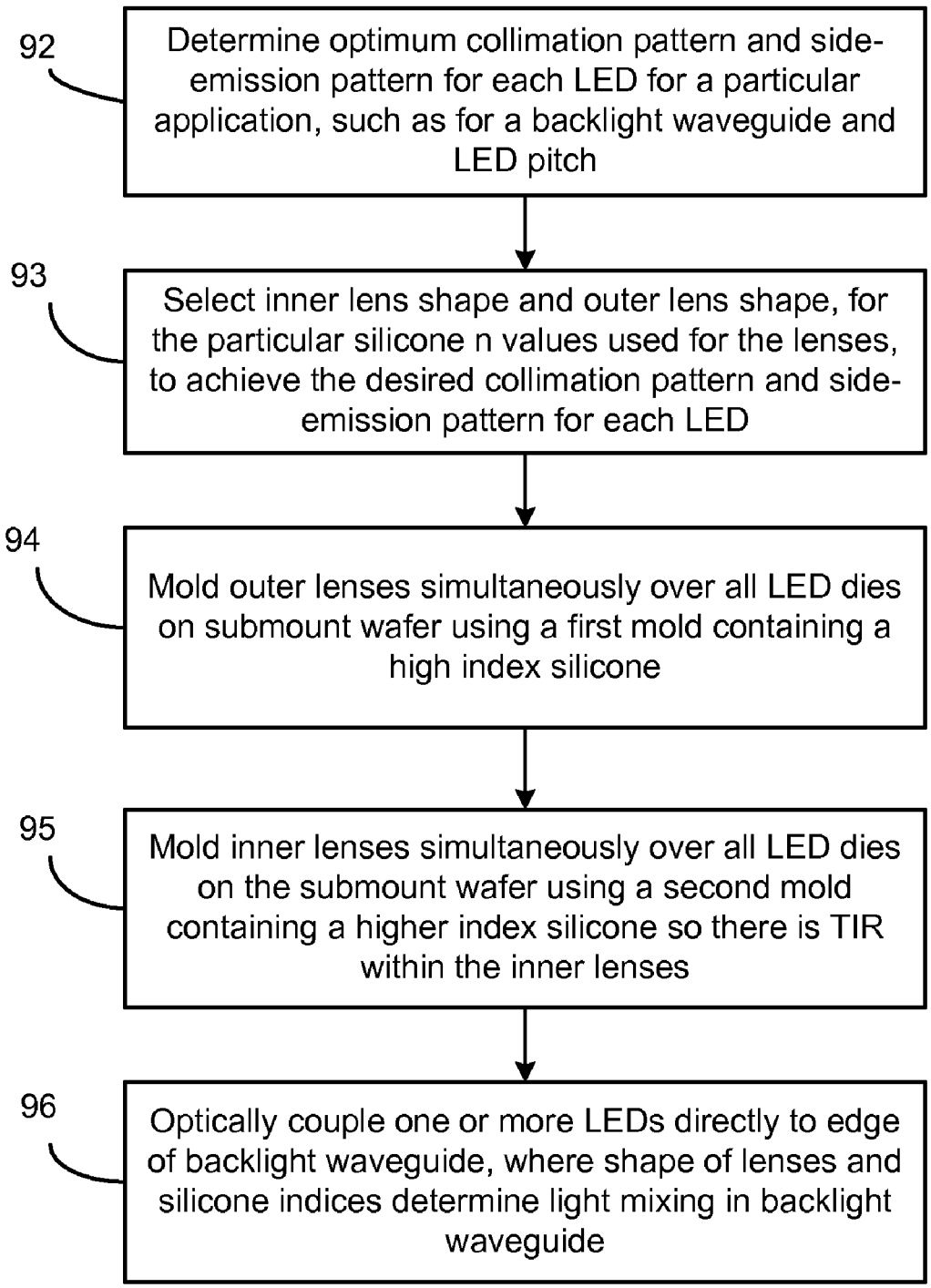
FIG. 15 is a flowchart identifying various steps used to form the double-molded LED lens in accordance with one embodiment of the invention.

FIG. 15 is a flowchart of various steps used to form lenses in accordance with one embodiment of the invention.

In step 92, the optimum collimation pattern and side-emission pattern are determined for each LED for a particular application, such as for a particular backlight application and LED pitch.

In step 93, the inner lens shape and outer lens shape, for the particular silicone n values used for the lenses, are then selected to achieve the desired collimation and side-emission patterns.

In step 94, the outer lenses are simultaneously molded around the peripheries of all the LED dies mounted on a submount wafer using a first mold containing a high n first silicone. The outer lens material may also encapsulate each LED die by providing a layer over the top surface of the LED dies.

In step 95, the collimating inner lenses are then simultaneously molded over the top surface of all the LED dies mounted on the submount wafer using a second mold containing a second silicone having a higher n than the first silicone so there is TIR within the inner lens. The walls of the center opening in the outer lens define the side walls of the inner lens.

In step 96, the LEDs with the double-molded lenses are optically coupled directly to the edge of a backlight waveguide, where the shape of the lenses and silicone indices of refraction determine the light mixing within the waveguide. The LEDs may also be used in an automotive application or other application.

Any combination of the disclosed inner and outer lens shapes may be utilized to achieve a desired emission pattern. All lenses may be symmetrical about a center axis to achieve a substantially symmetrical emission pattern or may be asymmetrical to achieve an asymmetrical emission pattern.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method of forming a lighting apparatus comprising:
   providing a light emitting diode (LED) die mounted on a submount, the LED die having a top surface;
   molding an outer lens onto the submount having the LED die such that the outer lens abuts at least two edges projecting from the top surface of the LED die and forms a layer above the top surface of the LED die using a first silicone having a first index of refraction, the outer lens forming a recess, relative to a top surface of the outer lens, above the top surface of the LED die; and
   after molding the outer lens, molding an inner lens within the recess using a second silicone having a second index of refraction higher than the first index of refraction,
   a shape of the inner lens acting to collimate light emitted by the top surface by total internal reflection (TIR), and
   a shape of the outer lens affecting a side emission pattern of light not internally reflected within the inner lens.

2. The method of claim 1 wherein the first index of refraction is at least 1.3 and the second index of refraction is at least 1.6.

3. The method of claim 1 wherein molding the outer lens comprises molding the outer lens to create a peak emission within 45°-65° from perpendicular to the top surface of the LED die.

4. The method of claim 1 wherein molding the inner lens comprises molding the inner lens to create a light spreading pattern between 10°-35° from perpendicular to the top surface of the LED die.

5. The method of claim 1 wherein molding the outer lens comprises molding the outer lens to have a semi-hemispherical shaped outer sidewall surface.

6. The method of claim 1 wherein molding the inner lens comprises molding the inner lens so that a top of the inner lens is flat.

7. The method of claim 1 wherein molding the inner lens comprises molding the inner lens so that a top of the inner lens has a light spreading feature.

8. The method of claim 1 wherein molding the inner lens and molding the outer lens comprise molding the inner lens and outer lens to be symmetrical about a center axis.

9. The method of claim 1 wherein molding the inner lens comprises molding the inner lens to be cylindrically shaped.

10. The method of claim 1 wherein molding the inner lens comprises molding the inner lens to be parabolically shaped.

11. The method of claim 1 wherein the layer above the top surface of the LED die has a non-flat shape to achieve a desired emission pattern.

12. The method of claim 11 wherein the layer includes light scattering features.

13. A lighting apparatus comprising:
a light emitting diode (LED) die mounted on a submount, the LED die having a top surface;
a molded outer lens abutting at least two edges projecting from the surface of the LED die and covering the top surface of the LED die, the outer lens comprising a first silicone having a first index of refraction, the outer lens including a recess, relative to a top surface of the outer lens, above top surface of the LED die; and
a molded inner lens within the recess, the inner lens comprising a second silicone having a second index of refraction higher than the first index of refraction,
a shape of the inner lens acting to collimate light emitted by the top surface by total internal reflection (TIR), and
a shape of the outer lens affecting a side emission pattern of light not internally reflected within the inner lens.

14. The apparatus of claim 13 wherein a plurality of LEDs having the inner lens and outer lens are optically coupled to an edge of a backlight waveguide.

15. The apparatus of claim 13 wherein the outer lens creates a peak emission within 45°-65° from perpendicular to the top surface of the LED die, and the inner lens creates a light spreading pattern between 10°-35° from perpendicular to the top surface of the LED die.

* * * * *